(12) United States Patent
Li et al.

(10) Patent No.: US 11,508,829 B2
(45) Date of Patent: Nov. 22, 2022

(54) SEMICONDUCTOR DEVICE AND MANUFACTURING METHOD THEREOF

(71) Applicant: INNOSCIENCE (ZHUHAI) TECHNOLOGY CO., LTD., Zhuhai (CN)

(72) Inventors: Chang An Li, Zhuhai (CN); Ming-Hong Chang, Zhuhai (CN); Jun Tang, Zhuhai (CN); Zi Ming Du, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 208 days.

(21) Appl. No.: 16/955,085

(22) PCT Filed: May 28, 2020

(86) PCT No.: PCT/CN2020/092883
§ 371 (c)(1),
(2) Date: Jun. 18, 2020

(87) PCT Pub. No.: WO2021/237563
PCT Pub. Date: Dec. 2, 2021

(65) Prior Publication Data
US 2022/0140108 A1    May 5, 2022

(51) Int. Cl.
*H01L 29/66* (2006.01)
*H01L 29/20* (2006.01)
(Continued)

(52) U.S. Cl.
CPC .... *H01L 29/66462* (2013.01); *H01L 29/2003* (2013.01); *H01L 29/452* (2013.01); *H01L 29/7786* (2013.01)

(58) Field of Classification Search
CPC .......... H01L 29/66462; H01L 29/2003; H01L 29/452; H01L 29/7786; H01L 29/7787
See application file for complete search history.

(56) References Cited

U.S. PATENT DOCUMENTS

2013/0248873 A1    9/2013    Kuraguchi et al.
2015/0060875 A1    3/2015    Kume et al.
(Continued)

FOREIGN PATENT DOCUMENTS

CN    101167190 A    4/2008
CN    104103684 A    10/2014
(Continued)

OTHER PUBLICATIONS

First Office Action of the corresponding China patent application No. 202080001456.3 dated Jul. 5, 2022.
(Continued)

*Primary Examiner* — Jose R Diaz
(74) *Attorney, Agent, or Firm* — Idea Intellectual Limited; Margaret A. Burke; Sam T. Yip

(57) ABSTRACT

Some embodiments of the disclosure provide a semiconductor device. The semiconductor device comprises: a substrate; a first nitride semiconductor layer on the substrate; a second nitride semiconductor layer on the first nitride semiconductor layer and having a band gap larger than a band gap of the first nitride semiconductor layer; an intermediate layer disposed on the second nitride semiconductor layer; and a conductive structure disposed on the intermediate layer, wherein a first even interface is formed between the intermediate layer and the second nitride semiconductor layer.

23 Claims, 10 Drawing Sheets

(51) Int. Cl.
*H01L 29/45* (2006.01)
*H01L 29/778* (2006.01)

(56) References Cited

U.S. PATENT DOCUMENTS

| | | | |
|---|---|---|---|
| 2016/0049347 A1* | 2/2016 | Negoro | H01L 21/02266 257/472 |
| 2020/0127116 A1* | 4/2020 | Chen | H01L 21/0254 |
| 2020/0381544 A1* | 12/2020 | Chen | H01L 29/66462 |

FOREIGN PATENT DOCUMENTS

| | | |
|---|---|---|
| CN | 107680998 A | 2/2018 |
| CN | 110875383 A | 3/2020 |
| CN | 111009580 A | 4/2020 |
| JP | 2013131653 A | 7/2013 |
| TW | 201236159 A1 | 9/2012 |

OTHER PUBLICATIONS

Qingjun Zhou, "Optimal Design of Embedded RAM and Research on Front-end and Back-end Key Technologies," Northwestern Polytechnical University Press, 2016, p. 128.

International Search Report and Written Opinion of the corresponding PCT application No. PCT/CN2020/092883 dated Feb. 25, 2021.

\* cited by examiner

SEMICONDUCTOR DEVICE AND MANUFACTURING METHOD THEREOF

TECHNICAL FIELD

The disclosure is related to a semiconductor device, and in particular, to a semiconductor device including a high-electron-mobility transistor (HEMT).

BACKGROUND

A semiconductor component including a direct band gap, for example, a semiconductor component including a III-V material or III-V compounds, may operate or work under a variety of conditions or environments (for example, different voltages or frequencies) due to its characteristics.

The foregoing semiconductor component may include a HEMT, a heterojunction bipolar transistor (HBT), a heterojunction field effect transistor (HFET), or a modulation-doped field effect transistor (MODFET).

SUMMARY OF THE INVENTION

Some embodiments of the disclosure provide a semiconductor device. The semiconductor device comprises: a substrate; a first nitride semiconductor layer on the substrate; a second nitride semiconductor layer on the first nitride semiconductor layer and having a band gap larger than a band gap of the first nitride semiconductor layer; an intermediate layer disposed on the second nitride semiconductor layer; and a conductive structure disposed on the intermediate layer, wherein a first even interface is formed between the intermediate layer and the second nitride semiconductor layer.

Some embodiments of the disclosure provide a semiconductor device. The semiconductor device comprises: a substrate; a first nitride semiconductor layer on the substrate; a second nitride semiconductor layer on the first nitride semiconductor layer and having a band gap larger than a band gap of the first nitride semiconductor layer; a first intermediate layer disposed on the second nitride semiconductor layer; and a first conductive structure disposed on the first intermediate layer, wherein the first intermediate layer under the first conductive structure has a substantially constant thickness.

Some embodiments of the disclosure provide a method for fabricating a semiconductor device. The method comprises: providing a substrate; forming a first nitride semiconductor layer on the substrate; forming a second nitride semiconductor layer having a band gap larger than a band gap of the first nitride semiconductor layer on the first nitride semiconductor layer; forming an intermediate layer on the second nitride semiconductor layer to stop diffusion of a first element; forming a first conductive layer having the first element on the intermediate layer, and performing an annealing operation.

BRIEF DESCRIPTION OF THE DRAWINGS

Aspects of the disclosure will become more comprehensible from the following detailed description made with reference to the accompanying drawings. It should be noted that, various features may not be drawn to scale. In fact, the sizes of the various features may be increased or reduced arbitrarily for the purpose of clear description.

PREFERRED EMBODIMENT OF THE PRESENT INVENTION

Figure 1A:
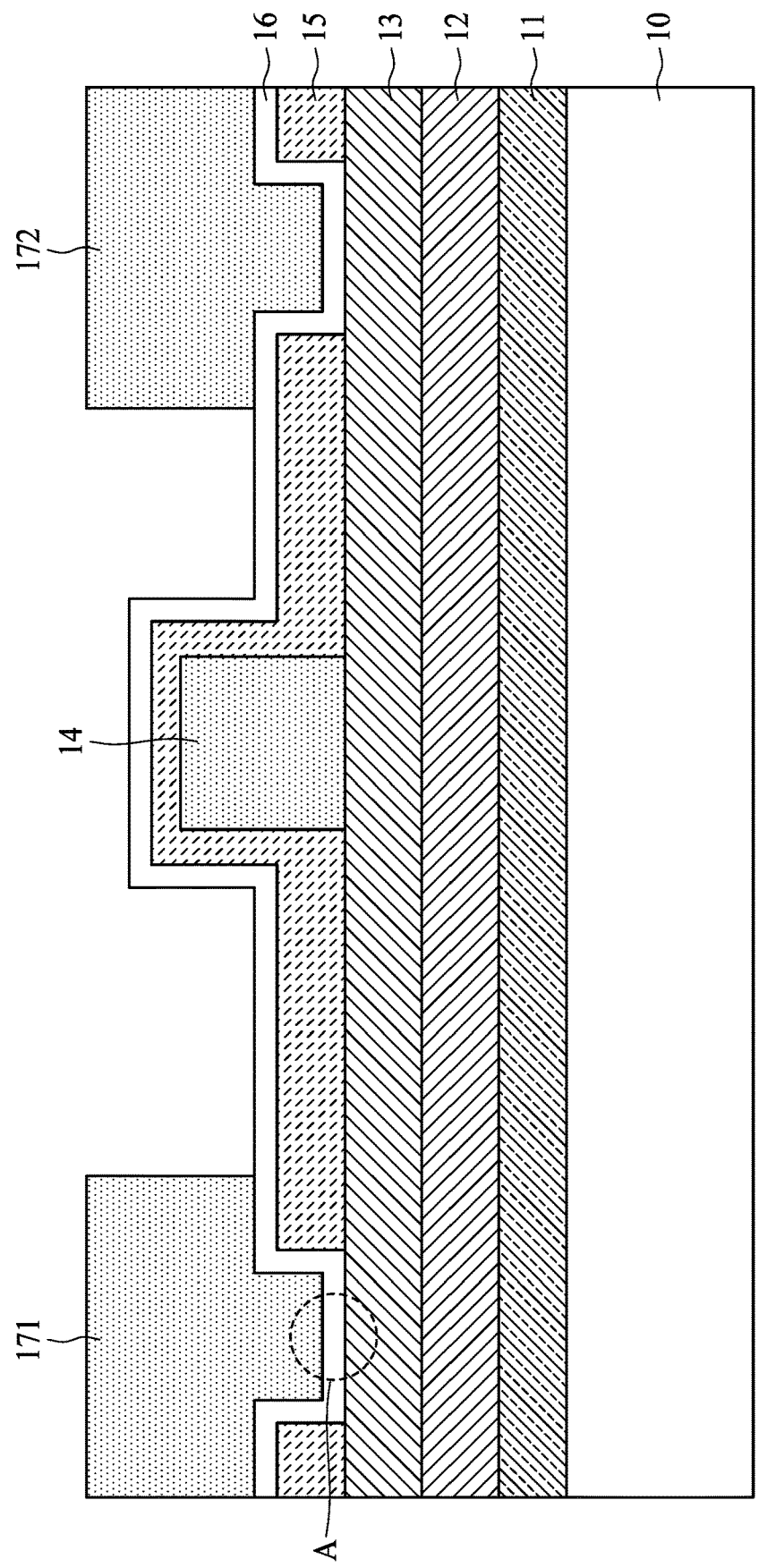
FIG. 1A is a side view of a semiconductor device according to some embodiments of the disclosure.

The following disclosure provides many different embodiments or examples for implementing different features of the provided subject matter. Specific examples of components and arrangements are described below. Certainly, these descriptions are merely examples and are not intended to be limiting. In the disclosure, in the following descriptions, the description of the first feature being formed on or above the second feature may include an embodiment in which the first feature and the second feature are formed to be in direct contact, and may further include an embodiment in which an additional feature may be formed between the first feature and the second feature to enable the first feature and the second feature to be not in direct contact. In addition, in the disclosure, reference numerals and/or letters may be repeated in examples. This repetition is for the purpose of simplification and clarity, and does not indicate a relationship between the described various embodiments and/or configurations.

The embodiments of the disclosure are described in detail below. However, it should be understood that many applicable concepts provided by the disclosure may be implemented in a plurality of specific environments. The described specific embodiments are only illustrative and do not limit the scope of the disclosure.

A direct band gap material, such as a III-V compound, may include but is not limited to, for example, gallium arsenide (GaAs), indium phosphide (InP), gallium nitride (GaN), Indium gallium arsenide (InGaAs), Indium aluminum arsenide (InAlAs), and the like.

FIG. 1A is a side view of a semiconductor device 1 according to some embodiments of the disclosure.

Figure 2:
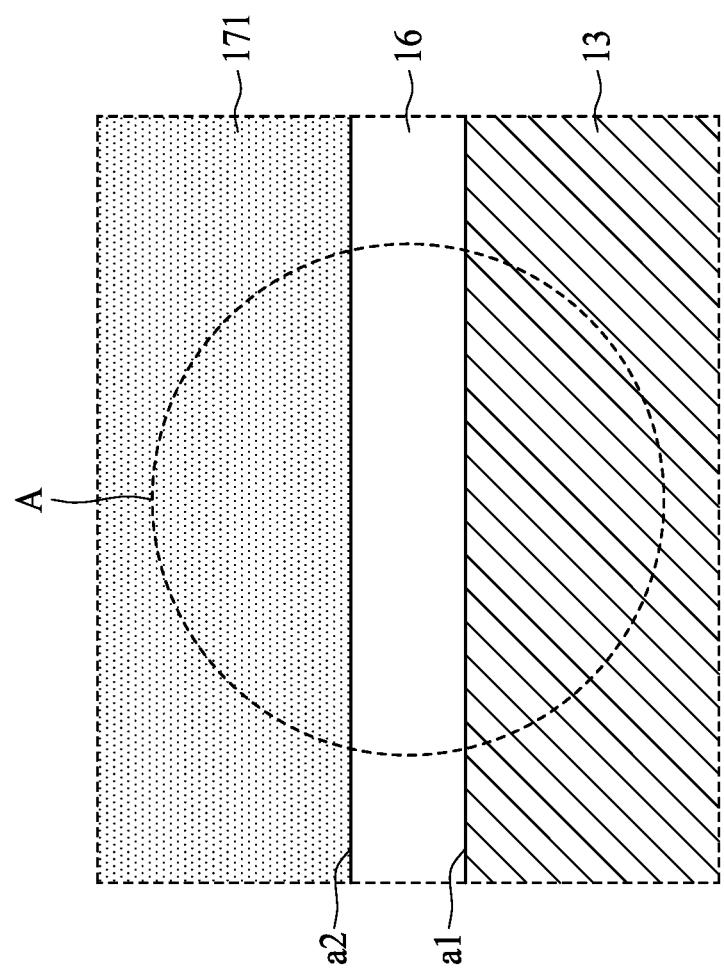
FIG. 2 is an enlarged view of structure according to some embodiments of the disclosure.

As shown in FIG. 1A, the semiconductor device 1 may include a substrate 10, a buffer layer 11, a semiconductor layer 12, a semiconductor layer 13, a conductive structure 14, a passivation layer 15, an intermediate layer 16, a conductive structure 171 and a conductive structure 172. The structure in dotted circle A in FIG. 1A is illustrated in FIG. 2.

The substrate 10 may include, for example, but is not limited to, silicon (Si), doped silicon (doped Si), silicon carbide (SiC), germanium silicide (SiGe), gallium arsenide (GaAs), or another semiconductor material. In some embodiments, the substrate 10 may include an intrinsic semiconductor material. In some embodiments, the substrate 10 may include a p-type semiconductor material. In some embodiments, the substrate 10 may include a silicon layer doped with boron (B). In some embodiments, the substrate 10 may include a silicon layer doped with gallium (Ga). In some embodiments, the substrate 10 may include an n-type semiconductor material. In some embodiments, the substrate 10 may include a silicon layer doped with arsenic (As). In some embodiments, the substrate 10 may include a silicon layer doped with phosphorus (P).

The buffer layer 11 may be disposed on the substrate 10. In some embodiments, the buffer layer 11 may include nitrides. In some embodiments, the buffer layer 11 may include, for example, but is not limited to, aluminum nitride (AlN). In some embodiments, the buffer layer 11 may include, for example, but is not limited to, aluminum gallium nitride (AlGaN). The buffer layer 11 may include a multi-layer structure. The buffer layer 11 may include a superlattice layer with periodic structure of two or more materials. The buffer layer 11 may include a single layer structure.

The semiconductor layer 12 may be disposed on the buffer layer 11. The semiconductor layer 12 may include a III-V material. The semiconductor layer 12 may be a nitride semiconductor layer. The semiconductor layer 12 may include, for example, but is not limited to, III nitride. The semiconductor layer 12 may include, for example, but is not limited to, GaN. The semiconductor layer 12 may include, for example, but is not limited to, AlN. The semiconductor layer 12 may include, for example, but is not limited to, InN. The semiconductor layer 12 may include, for example, but is not limited to, compound $In_xAl_yGa_{1-x-y}N$, where $x+y \le 1$. The semiconductor layer 12 may include, for example, but is not limited to, compound $Al_yGa_{(1-y)}N$, where $y \le 1$.

The semiconductor layer 13 may be disposed on the semiconductor layer 12. The semiconductor layer 13 may include a III-V material. The semiconductor layer 13 may be a nitride semiconductor layer. The semiconductor layer 13 may include, for example, but is not limited to, III nitride. The semiconductor layer 13 may include, for example, but is not limited to, compound $Al_yGa_{(1-y)}N$, where $y \le 1$. The semiconductor layer 13 may include, for example, but is not limited to, GaN. The semiconductor layer 13 may include, for example, but is not limited to, AlN. The semiconductor layer 13 may include, for example, but is not limited to, InN. The semiconductor layer 13 may include, for example, but is not limited to, compound $In_xAl_yGa_{1-x-y}N$, where $x+y \le 1$.

A heterojunction may be formed between the semiconductor layer 13 and the semiconductor layer 12. The semiconductor layer 13 may have a band gap larger than a band gap of the semiconductor layer 12. For example, the semiconductor layer 13 may include AlGaN that may have a band gap of about 4 eV, and the semiconductor layer 12 may include GaN that may have a band gap of about 3.4 eV.

In the semiconductor device 1, the semiconductor layer 12 may be used as a channel layer. In the semiconductor device 1, the semiconductor layer 12 may be used as a channel layer disposed on the buffer layer 11. In the semiconductor device 1, the semiconductor layer 13 may be used as a barrier layer. In the semiconductor device 1, the semiconductor layer 13 may be used as a barrier layer disposed on the semiconductor layer 12.

In the semiconductor device 1, because the band gap of the semiconductor layer 12 is less than the band gap of the semiconductor layer 13, two dimensional electron gas (2DEG) may be formed in the semiconductor layer 12. In the semiconductor device 1, because the band gap of the semiconductor layer 12 is less than the band gap of the semiconductor layer 13, 2DEG may be formed in the semiconductor layer 12 and the 2DEG is close to the interface of the semiconductor layer 13 and the semiconductor layer 12. In the semiconductor device 1, because the band gap of the semiconductor layer 13 is larger than the band gap of the semiconductor layer 12, 2DEG may be formed in the semiconductor layer 12. In the semiconductor device 1, because the band gap of the semiconductor layer 13 is larger than the band gap of the semiconductor layer 12, 2DEG may be formed in the semiconductor layer 12 and the 2DEG is close to the interface of the semiconductor layer 13 and the semiconductor layer 12.

The conductive structure 14 may be disposed on the semiconductor layer 13. The conductive structure 14 may include a metal. The conductive structure 14 may include, for example, but is not limited to, gold (Au), platinum (Pt), titanium (Ti), palladium (Pd), nickel (Ni), and tungsten (W). The conductive structure 14 may include a metal compound. The conductive structure 14 may include, for example, but is not limited to, titanium nitride (TiN).

In the semiconductor device 1, the conductive structure 14 may be used as a gate conductor. In the semiconductor device 1, the conductive structure 14 may be configured to control the 2DEG in the semiconductor layer 12. In the semiconductor device 1, a voltage may be applied to the conductive structure 14 to control the 2DEG in the semiconductor layer 12. In the semiconductor device 1, a voltage may be applied to the conductive structure 14 to control the 2DEG in the semiconductor layer 12 and below the conductive structure 14. In the semiconductor device 1, a voltage may be applied to the conductive structure 14 to control the connection or disconnection between the conductive structure 171 and the conductive structure 172.

In the semiconductor device 1, a doped semiconductor layer may be disposed between the semiconductor layer 13 and the conductive structure 14 (not shown in FIG. 1A). The doped semiconductor layer may include a doped III-V material. The doped semiconductor layer may include a p-type III-V material. The doped semiconductor layer may include, for example, but is not limited to, p-type III nitride. The doped semiconductor layer may include, for example, but is not limited to, p-type GaN.

The passivation layer 15 may be disposed on the semiconductor layer 13. The passivation layer 15 may surround the conductive structure 14. The passivation layer 15 may cover the conductive structure 14. The passivation layer 15 may separate the conductive structure 14 from the intermediate layer 16. The passivation layer 15 may include a dielectric material. The passivation layer 15 may include nitride. The passivation layer 15 may include, for example, but is not limited to, silicon nitride ($Si_3N_4$). The passivation layer 15 may include oxide. The passivation layer 15 may include, for example, but is not limited to, silicon oxide ($SiO_2$). The passivation layer 15 may electrically isolate the conductive structure 14. The passivation layer 15 may electrically isolate the conductive structure 171. The passivation layer 15 may electrically isolate the conductive structure 172.

The intermediate layer 16 may be disposed on the semiconductor layer 13. The intermediate layer 16 may be disposed on the passivation layer 15. The intermediate layer 16 may cover the passivation layer 15. The intermediate layer 16 may cover a portion of the passivation layer 15. The intermediate layer 16 may surround the passivation layer 15. The intermediate layer 16 may be disposed between the semiconductor layer 13 and the conductive structure 171. The intermediate layer 16 may be disposed between the semiconductor layer 13 and the conductive structure 172.

The intermediate layer 16 may include a nitride layer. The intermediate layer 16 may include a metal nitride layer. The intermediate layer 16 may include, for example, but is not limited to, TiN, AlN and the combination thereof. The intermediate layer 16 may protect the semiconductor layer 13. The intermediate layer 16 may protect the semiconductor layer 13 during an annealing operation. The intermediate layer 16 may protect the semiconductor layer 13 from the diffusion of the conductive structure 171 during an annealing operation. The intermediate layer 16 may protect the semiconductor layer 13 from the diffusion of the conductive structure 172 during an annealing operation.

The intermediate layer 16 may have a uniform thickness. The intermediate layer 16 may have a consistent thickness. The intermediate layer 16 may have a constant thickness. The intermediate layer 16 may include a thickness ranging from approximately 4.5 nm to approximately 15 nm. The intermediate layer 16 may include a thickness ranging from approximately 4.5 nm to approximately 9 nm. The intermediate layer 16 may include a thickness of about 5 nm.

The intermediate layer 16 may not affect the transmission of the carriers. The intermediate layer 16 may not degrade the transmission of the carriers. The intermediate layer 16 may not affect the transmission of the electrons. The intermediate layer 16 may not affect the transmission of the electrons between the semiconductor layer 13 and the conductive structure 171. The intermediate layer 16 may not affect the transmission of the electrons between the semiconductor layer 13 and the conductive structure 172.

The intermediate layer 16 may form an ohmic contact with the semiconductor layer 13. The intermediate layer 16 may form a low-resistance ohmic contact. The intermediate layer 16 may reduce the resistance of an ohmic contact to about 0.3 Ω·mm. The intermediate layer 16 and the conductive structure 171 may form an ohmic contact with the semiconductor layer 13. The intermediate layer 16 may stop diffusion of the element of the conductive structure 171. The intermediate layer 16 may block diffusion of the element of the conductive structure 171. The intermediate layer 16 may alleviate diffusion of the element of the conductive structure 171. The intermediate layer 16 may prevent the element of the conductive structure 171 from entering the semiconductor layer 13. The intermediate layer 16 may make the semiconductor layer 13 devoid of the element of the conductive structure 171. The intermediate layer 16 may make the semiconductor layer 13 devoid of at least one of titanium, aluminum, and silicon of the conductive structure 171. The intermediate layer 16 and the conductive structure 172 may form an ohmic contact with the semiconductor layer 13. The intermediate layer 16 may stop diffusion of the element of the conductive structure 172. The intermediate layer 16 may block diffusion of the element of the conductive structure 172. The intermediate layer 16 may alleviate diffusion of the element of the conductive structure 172. The intermediate layer 16 may prevent the element of the conductive structure 172 from entering the semiconductor layer 13. The intermediate layer 16 may make the semiconductor layer 13 devoid of the element of the conductive structure 172. The intermediate layer 16 may make the semiconductor layer 13 devoid of at least one of titanium, aluminum, and silicon of the conductive structure 172.

The conductive structure 171 may be disposed on the semiconductor layer 13 and the intermediate layer 16. The conductive structure 171 may be spaced apart from the semiconductor layer 13 by the intermediate layer 16. The conductive structure 171 may include a conductive material. The conductive structure 171 may include a semiconductive material. The conductive structure 171 may include a metal. The conductive structure 171 may include, for example, but is not limited to, Al, Ti, and Si.

The conductive structure 172 may be disposed on the semiconductor layer 13 and the intermediate layer 16. The conductive structure 172 may be spaced apart from the semiconductor layer 13 by the intermediate layer 16. The conductive structure 172 may include a conductive material. The conductive structure 172 may include a semiconductive material. The conductive structure 172 may include a metal. The conductive structure 172 may include, for example, but is not limited to, Al, Ti, and Si.

In the semiconductor device 1, the conductive structure 171 may be used as, for example, but is not limited to, a drain conductor. In the semiconductor device 1, the conductive structure 171 may be used as, for example, but is not limited to, a source conductor.

In the semiconductor device 1, the conductive structure 172 may be used as, for example, but is not limited to, a source conductor. In the semiconductor device 1, the conductive structure 172 may be used as, for example, but is not limited to, a drain conductor.

In some embodiments, the conductive structure 171 may be used as a source conductor of the semiconductor device 1, the conductive structure 172 may be used as a drain conductor of the semiconductor device 1, and the conductive structure 14 may be used as a gate conductor of the semiconductor device 1. Although the conductive structure 171 that may be used as a source conductor and the conductive structure 172 that may be used as a drain conductor are respectively disposed on both sides of the conductive structure 14 that may be used as a gate conductor in FIG. 1A, the conductive structure 171, the conductive structure 172, and the conductive structure 14 may be disposed differently in other embodiments of the disclosure according to design requirements.

Figure 1B:
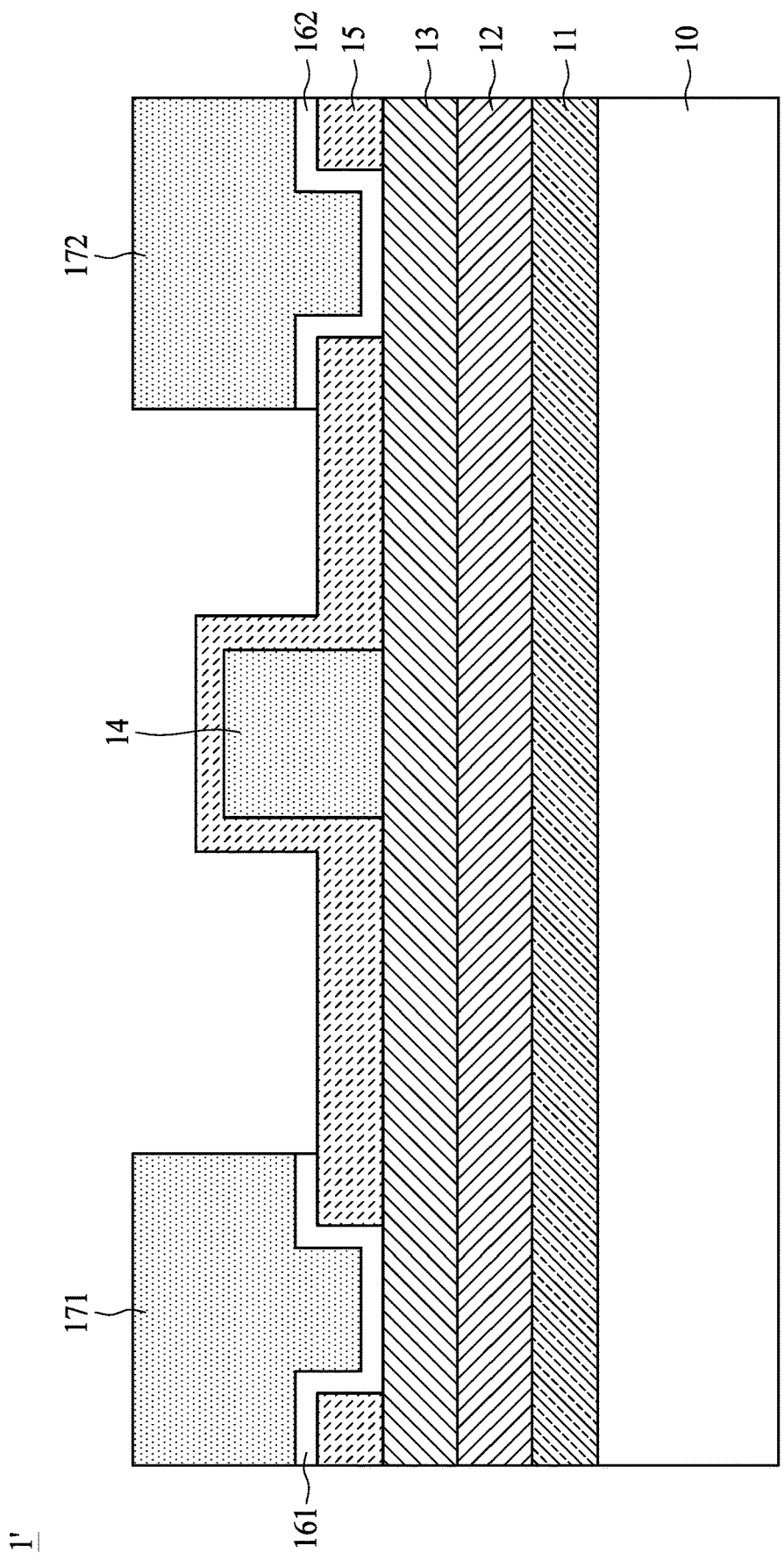
FIG. 1B is a side view of a semiconductor device according to some embodiments of the disclosure.

FIG. 1B is a side view of a semiconductor device 1' according to some embodiments of the disclosure.

As shown in FIG. 1B, the semiconductor device 1' may include an intermediate layer 161 and an intermediate layer 162. The semiconductor device 1' shown in FIG. 1B is similar to the semiconductor device 1 shown in FIG. 1A, but differs in that the intermediate layer 16 of the semiconductor device 1 shown in FIG. 1A is replaced by the intermediate layer 161 and the intermediate layer 162.

The intermediate layer 161 and the intermediate layer 162 may be separated. The intermediate layer 161 and the intermediate layer 162 may be separated by the passivation layer 15. The intermediate layer 161 and the intermediate layer 162 may be independent from each other.

The intermediate layer 161 may be disposed on the semiconductor layer 13. The intermediate layer 161 may be disposed on the passivation layer 15. The intermediate layer 161 may cover a portion of the passivation layer 15. The intermediate layer 161 may be disposed between the semiconductor layer 13 and the conductive structure 171.

The intermediate layer 161 may include a nitride layer. The intermediate layer 161 may include a metal nitride layer. The intermediate layer 161 may include, for example, but is not limited to, TiN. The intermediate layer 161 may include, for example, but is not limited to, AlN. The intermediate layer 161 may include at least one of TiN and AlN.

The intermediate layer 161 may have a uniform thickness. The intermediate layer 161 may have a consistent thickness. The intermediate layer 161 may have a constant thickness. The intermediate layer 161 may include a thickness ranging from approximately 4.5 nm to approximately 15 nm. The intermediate layer 161 may include a thickness ranging from approximately 4.5 nm to approximately 9 nm. The intermediate layer 161 may include a thickness of about 5 nm.

The intermediate layer 161 may not affect the transmission of the carriers. The intermediate layer 161 may not degrade the transmission of the carriers. The intermediate layer 161 may not affect the transmission of the electrons.

The intermediate layer 161 may not affect the transmission of the electrons between the semiconductor layer 13 and the conductive structure 171.

The intermediate layer 161 may form an ohmic contact with the semiconductor layer 13. The intermediate layer 161 may form a low-resistance ohmic contact. The intermediate layer 161 may reduce the resistance of an ohmic contact to about 0.3 Ω·mm. The intermediate layer 161 and the conductive structure 171 may form an ohmic contact with the semiconductor layer 13. The intermediate layer 161 may stop diffusion of the element of the conductive structure 171. The intermediate layer 161 may block diffusion of the element of the conductive structure 171. The intermediate layer 161 may alleviate diffusion of the element of the conductive structure 171. The intermediate layer 161 may prevent the element of the conductive structure 171 from entering the semiconductor layer 13. The intermediate layer 161 may make the semiconductor layer 13 devoid of the element of the conductive structure 171. The intermediate layer 161 may make the semiconductor layer 13 devoid of at least one of titanium, aluminum, and silicon of the conductive structure 171.

The intermediate layer 162 may be disposed on the semiconductor layer 13. The intermediate layer 162 may be disposed on the passivation layer 15. The intermediate layer 162 may cover a portion of the passivation layer 15. The intermediate layer 162 may be disposed between the semiconductor layer 13 and the conductive structure 172.

The intermediate layer 162 may include a nitride layer. The intermediate layer 162 may include a metal nitride layer. The intermediate layer 162 may include, for example, but is not limited to, TiN. The intermediate layer 162 may include, for example, but is not limited to, AlN. The intermediate layer 162 may include at least one of TiN and AlN.

The intermediate layer 162 may have a uniform thickness. The intermediate layer 162 may have a consistent thickness. The intermediate layer 162 may have a constant thickness. The intermediate layer 162 may include a thickness ranging from approximately 4.5 nm to approximately 15 nm. The intermediate layer 162 may include a thickness ranging from approximately 4.5 nm to approximately 9 nm. The intermediate layer 162 may include a thickness of about 5 nm.

The intermediate layer 162 may not affect the transmission of the carriers. The intermediate layer 162 may not degrade the transmission of the carriers. The intermediate layer 162 may not affect the transmission of the electrons. The intermediate layer 162 may not affect the transmission of the electrons between the semiconductor layer 13 and the conductive structure 172.

The intermediate layer 162 may form an ohmic contact with the semiconductor layer 13. The intermediate layer 162 may form a low-resistance ohmic contact. The intermediate layer 162 may reduce the resistance of an ohmic contact to about 0.3 Ω·mm. The intermediate layer 162 and the conductive structure 172 may form an ohmic contact with the semiconductor layer 13. The intermediate layer 162 may stop diffusion of the element of the conductive structure 172. The intermediate layer 162 may block diffusion of the element of the conductive structure 172. The intermediate layer 162 may alleviate diffusion of the element of the conductive structure 172. The intermediate layer 162 may prevent the element of the conductive structure 172 from entering the semiconductor layer 13. The intermediate layer 162 may make the semiconductor layer 13 devoid of the element of the conductive structure 172. The intermediate layer 162 may make the semiconductor layer 13 devoid of at least one of titanium, aluminum, and silicon of the conductive structure 172.

FIG. 2 is an enlarged view of structure in dotted circle A as shown in FIG. 1A in accordance with some embodiments of the present disclosure.

As shown in FIG. 2, the semiconductor layer 13, the intermediate layer 16, and the conductive structure 171 may be included in the dotted circle A. An interface a1 may be formed between the intermediate layer 16 and the semiconductor layer 13. An interface a2 may be formed between the intermediate layer 16 and the conductive structure 171.

The interface a1 may be substantially even. The interface a1 may be substantially flat. The interface a1 may be substantially smooth. The interface a1 may be substantially clear. The interface a1 may be substantially continuous.

The interface a2 may be substantially even. The interface a2 may be substantially flat. The interface a2 may be substantially smooth. The interface a2 may be substantially clear. The interface a2 may be substantially continuous.

The distance between the interface a1 and the interface a2 may range from approximately 4.5 nm to approximately 15 nm. The distance between the interface a1 and the interface a2 may range from approximately 4.5 nm to approximately 9 nm. The distance between the interface a1 and the interface a2 may be about 5 nm.

It should be noted that, the intermediate layer 16 may be applied due to the mechanism of the tunneling effect. It should be noted that, the intermediate layer 16 may be inserted between the semiconductor layer 13 and the conductive structure 171 due to the mechanism of the tunneling effect.

It should be noted that, the distance between the interface a1 and the interface a2 is close enough to let carriers pass through. It should be noted that, the distance between the interface a1 and the interface a2 is close enough to let electrons pass through. It should be noted that, the distance between the interface a1 and the interface a2 is close enough to let holes pass through. It should be noted that, the thickness of the intermediate layer 16 is thin enough to transmit carriers. It should be noted that, the thickness of the intermediate layer 16 is thin enough to transmit electrons. It should be noted that, the thickness of the intermediate layer 16 is thin enough to transmit holes. It should be noted that, due to the application of the intermediate layer 16, the semiconductor layer 13 may be devoid of the element of the conductive structure 171. It should be noted that, due to the application of the intermediate layer 16, the element of the conductive structure 171 may not diffuse into the semiconductor layer 13. It should be noted that, due to the application of the intermediate layer 16, the element, such as Ti, of the conductive structure 171 may not diffuse into the semiconductor layer 13. It should be noted that, due to the application of the intermediate layer 16, the element, such as Si, of the conductive structure 171 may not diffuse into the semiconductor layer 13. It should be noted that, due to the application of the intermediate layer 16, the resistance of the ohmic contact may be reduced. It should be noted that, due to the application of the intermediate layer 16, the resistance of the ohmic contact between the semiconductor layer 13 and the conductive structure 171 may be reduced.

FIG. 3A, FIG. 3B, FIG. 3C, FIG. 3D, and FIG. 3E show several operations for manufacturing a semiconductor device according to some embodiments of the disclosure. FIG. 3A, FIG. 3B, FIG. 3C, FIG. 3D, and FIG. 3E depict several operations for manufacturing the semiconductor device 1 shown in FIG. 1A.

Figure 3A:
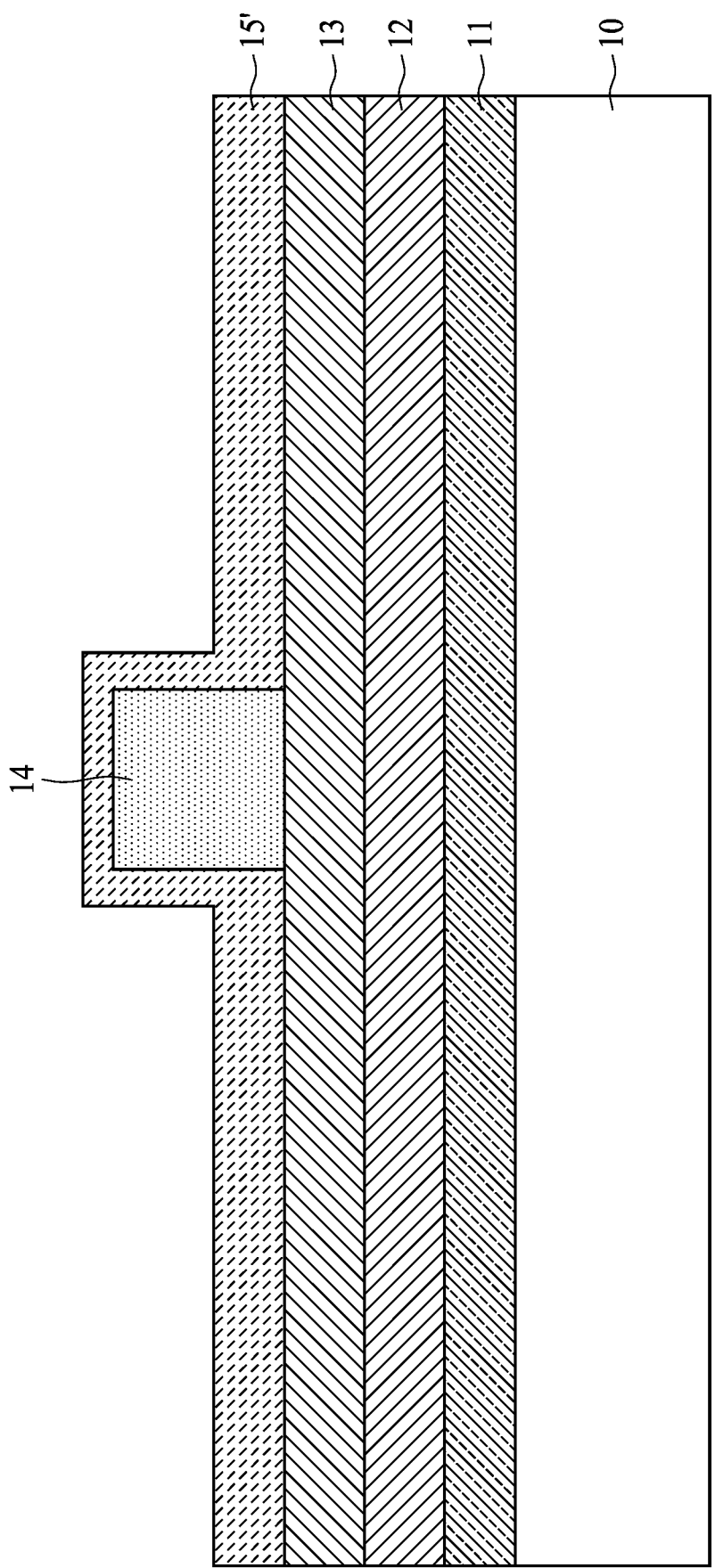
FIG. 3A, FIG. 3B, FIG. 3C, FIG. 3D, and FIG. 3E show several operations for manufacturing a semiconductor device according to some embodiments of the disclosure.

Referring to FIG. 3A, a substrate 10 is provided. In some embodiments, the substrate 10 may include a silicon substrate. In some embodiments, the substrate 10 may be an intrinsic silicon substrate. In some embodiments, the substrate 10 may be doped with a dopant. In some embodiments, the substrate 10 may include a p-type semiconductor substrate. In some embodiments, the substrate 10 may be doped with at least one of boron (B) and gallium (Ga) to form a p-type semiconductor substrate. In some embodiments, the substrate 10 may include an n-type semiconductor substrate. In some embodiments, the substrate 10 may be doped with at least one of phosphorus (P) and arsenic (As) to form an n-type semiconductor substrate.

In some embodiments, a buffer layer 11 is disposed on the substrate 10. In some embodiments, the buffer layer 11 may be formed through chemical vapor deposition (CVD) and/or another suitable deposition step. In some embodiments, the buffer layer 11 may be formed on the substrate 10 through CVD and/or another suitable deposition step.

In some embodiments, a semiconductor layer 12 is disposed on the buffer layer 11. In some embodiments, the semiconductor layer 12 may be formed through CVD and/or another suitable deposition step. In some embodiments, the semiconductor layer 12 may be formed on the buffer layer 11 through CVD and/or another suitable deposition step.

In some embodiments, a semiconductor layer 13 is disposed on the semiconductor layer 12. In some embodiments, the semiconductor layer 13 may be formed through CVD and/or another suitable deposition step. In some embodiments, the semiconductor layer 13 may be formed on the semiconductor layer 12 through CVD and/or another suitable deposition step. It should be noted that, the semiconductor layer 13 may be formed after forming the semiconductor layer 12. It should be noted that, a heterojunction may be formed when the semiconductor layer 13 is disposed on the semiconductor layer 12. It should be noted that, a band gap of the semiconductor layer 13 may be larger than a band gap of the semiconductor layer 12. It should be noted that, due to the polarization phenomenon of the formed heterojunction between the semiconductor layer 13 and the semiconductor layer 12, 2DEG may be formed in the semiconductor layer 12. It should be noted that, due to the polarization phenomenon of the formed heterojunction between the semiconductor layer 13 and the semiconductor layer 12, 2DEG may be formed in the semiconductor layer 12 and close to an interface between the semiconductor layer 12 and the semiconductor layer 13.

In some embodiments, a conductive structure 14 is disposed on the semiconductor layer 13. In some embodiments, the conductive structure 14 may be formed through CVD and/or another suitable deposition step. In some embodiments, the conductive structure 14 may be formed on the semiconductor layer 13 through CVD and/or another suitable deposition step and patterning.

In some embodiments, a passivation layer 15' is disposed on the semiconductor layer 13. In some embodiments, the passivation layer 15' is disposed on the conductive structure 14. In some embodiments, the passivation layer 15' may be formed through a deposition step. In some embodiments, the passivation layer 15' may be formed on the semiconductor layer 13 through CVD and/or another suitable deposition step. In some embodiments, the passivation layer 15' may be formed on the semiconductor layer 13 through CVD and/or another suitable deposition step and encircle the conductive structure 14.

Figure 3B:
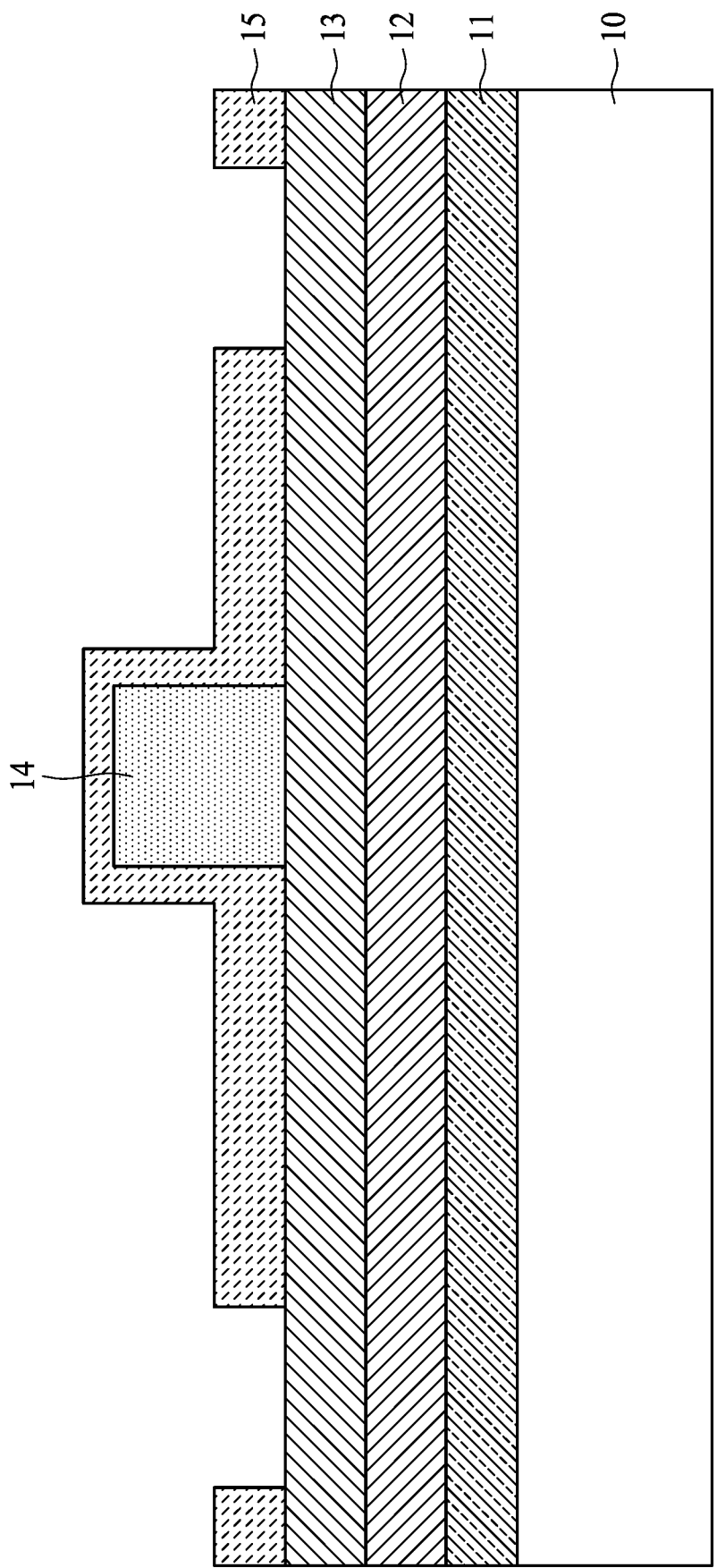

Referring to FIG. 3B, a passivation layer 15 is formed. In some embodiments, the passivation layer 15 may be formed by removing a part of the passivation layer 15' shown in FIG. 3A. In some embodiments, the passivation layer 15 may be formed by etching a part of the passivation layer 15' shown in FIG. 3A. In some embodiments, a passivation layer 15 may be formed to expose a part of the semiconductor layer 13.

Figure 3C:
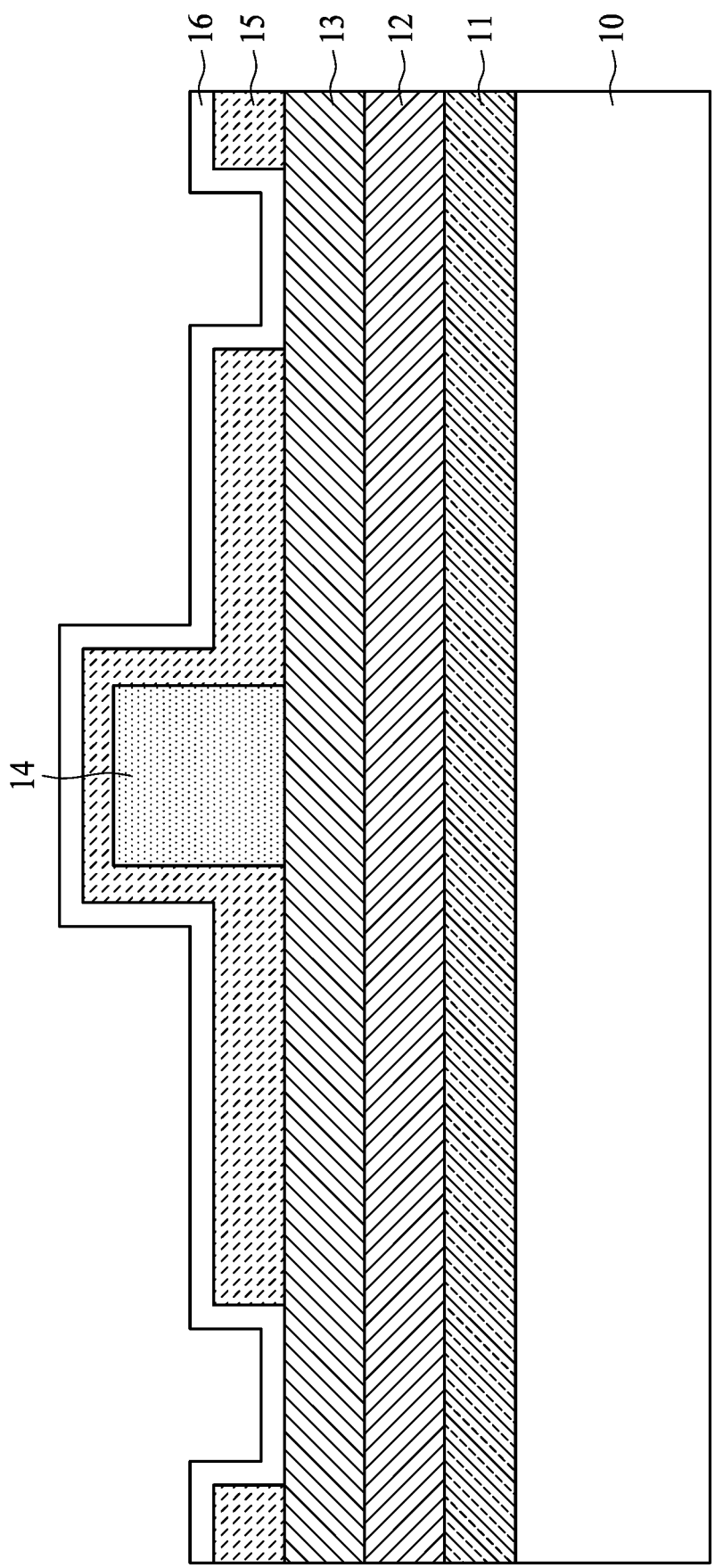

Referring to FIG. 3C, an intermediate layer 16 is formed. In some embodiments, the intermediate layer 16 may be disposed on the semiconductor layer 13. In some embodiments, the intermediate layer 16 may be disposed on the passivation layer 15. In some embodiments, the intermediate layer 16 may be formed through CVD and/or another suitable deposition step. In some embodiments, the intermediate layer 16 may be formed on the semiconductor layer 13 through CVD and/or another suitable deposition step. In some embodiments, the intermediate layer 16 may be formed on the passivation layer 15 through CVD and/or another suitable deposition step.

In some embodiments, the duration for forming the intermediate layer 16 may be between 10 to 30 seconds. In some embodiments, the duration for forming the intermediate layer 16 may be between 15 to 25 seconds. In some embodiments, the duration for forming the intermediate layer 16 may be around 20 seconds. In some embodiments, the intermediate layer 16 may be formed to have a thickness ranging from approximately 3 nm to approximately 15 nm. In some embodiments, the intermediate layer 16 may be formed to have a thickness ranging from approximately 4.5 nm to approximately 15 nm. In some embodiments, the intermediate layer 16 may be formed to have a thickness ranging from approximately 4.5 nm to approximately 9 nm. In some embodiments, the intermediate layer 16 may be formed to have a thickness of about 5 nm.

Figure 3D:
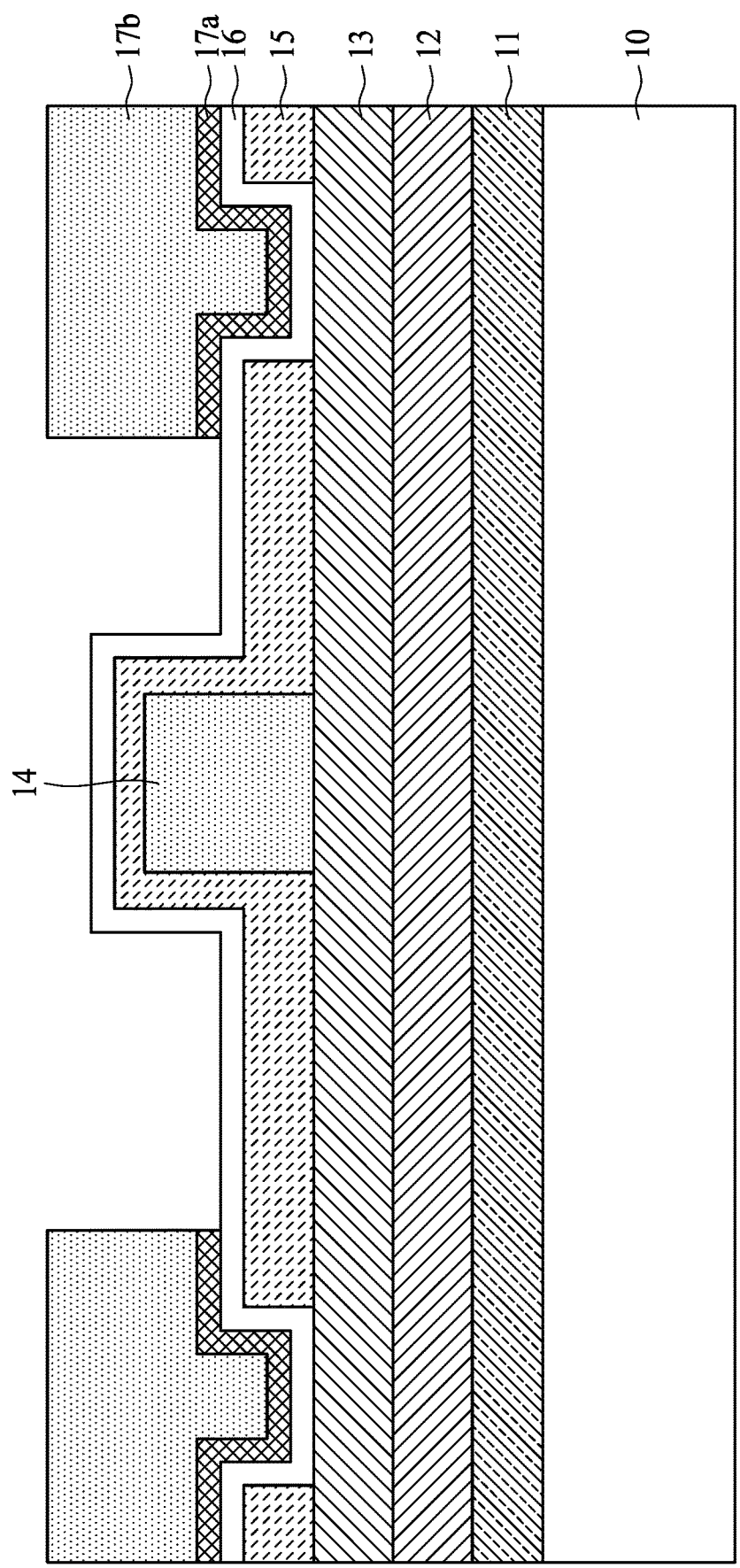

Referring to FIG. 3D, a conductive structure 17a is formed. In some embodiments, the conductive structure 17a may be disposed on the intermediate layer 16. In some embodiments, the conductive structure 17a may be formed through physical vapor deposition (PVD), atomic layer deposition (ALD) and/or another suitable deposition step. It should be noted that, the intermediate layer 16 may be disposed between the conductive structure 17a and the passivation layer 15. It should be noted that, the intermediate layer 16 may be disposed between the conductive structure 17a and the semiconductor layer 13.

Also referring to FIG. 3D, a conductive structure 17b is formed. In some embodiments, the conductive structure 17b may be disposed on the conductive structure 17a. In some embodiments, the conductive structure 17b may be formed through PVD, ALD and/or another suitable deposition step. It should be noted that, the conductive structure 17b may have a material different from that of the conductive structure 17a. It should be noted that, the conductive structure 17b may have an element different from that of the conductive structure 17a. In some embodiments, the conductive structure 17a may include, but is not limited to, Ti and the conductive structure 17b may include, but is not limited to, Al. In some embodiments, the conductive structure 17a may include, but is not limited to, Ti and the conductive structure 17b may include, but is not limited to, Si.

Figure 3E:
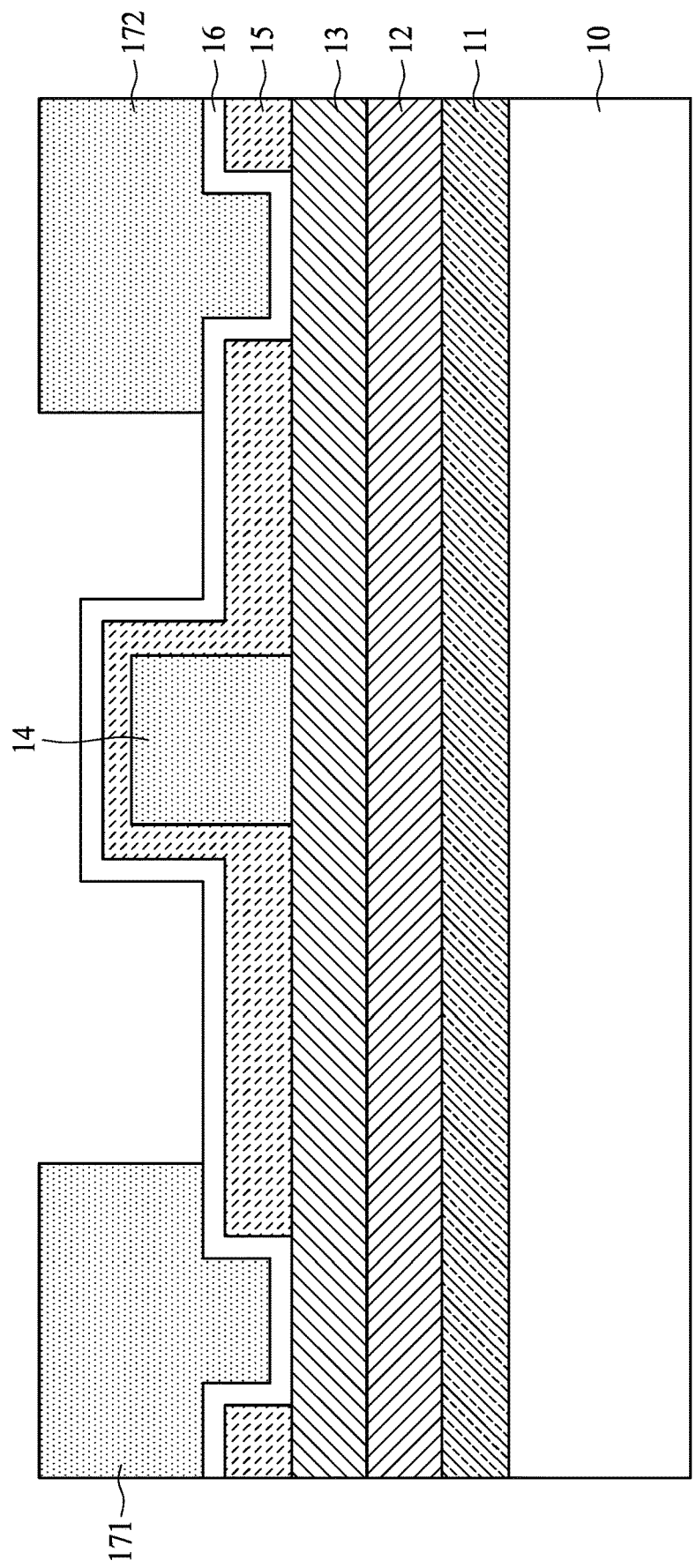

Referring to FIG. 3E, a heat treatment is performed. In some embodiments, a thermal operation may be performed. In some embodiments, a rapid thermal processing (RTP) may be performed. In some embodiments, an annealing operation may be performed. In some embodiments, the annealing operation may be performed at the temperature between approximately 600° C. and 800° C. In some embodiments, the annealing operation may be performed at the temperature between approximately 650° C. and 750° C. In some embodiments, the annealing operation may be performed at the temperature about 700° C. In some embodiments, the annealing operation may be performed for the duration between approximately 10 seconds and 50 seconds. In some embodiments, the annealing operation may be performed for the duration between approximately 20 seconds and 40 seconds. In some embodiments, the annealing operation may be performed for the duration of around 30 seconds.

Also referring to FIG. 3E, a conductive structure 171 and a conductive structure 172 are formed. In some embodiments, the conductive structure 171 may be formed due to the annealing operation. In some embodiments, the conductive structure 172 may be formed due to the annealing operation.

In some embodiments, the conductive structure 171 may be formed by merging the conductive structure 17a and the conductive structure 17b. In some embodiments, the conductive structure 172 may be formed by merging the conductive structure 17a and the conductive structure 17b. In some embodiments, the conductive structure 171 may be formed by combining the conductive structure 17a and the conductive structure 17b. In some embodiments, the conductive structure 172 may be formed by combining the conductive structure 17a and the conductive structure 17b. In some embodiments, the conductive structure 171 may be formed by melting the conductive structure 17a and the conductive structure 17b. In some embodiments, the conductive structure 172 may be formed by melting the conductive structure 17a and the conductive structure 17b.

It should be noted that, the conductive structure 171 may include the materials of the conductive structure 17a and the materials of the conductive structure 17b. It should be noted that, the conductive structure 172 may include the materials of the conductive structure 17a and the materials of the conductive structure 17b. It should be noted that, the conductive structure 171 may be regarded as one single layer. It should be noted that, the conductive structure 172 may be regarded as one single layer. It should be noted that, the conductive structure 171 may include, but is not limited to, Ti and Al. It should be noted that, the conductive structure 172 may include, but is not limited to, Ti and Al. It should be noted that, the conductive structure 171 may include, but is not limited to, Ti, Al and Si. It should be noted that, the conductive structure 172 may include, but is not limited to, Ti, Al and Si.

It should be noted that, the material of the conductive structure 17a does not diffuse into the semiconductor layer 13. It should be noted that, the material of the conductive structure 17b does not diffuse into the semiconductor layer 13. It should be noted that, the material of the conductive structure 171 does not diffuse into the semiconductor layer 13. It should be noted that, the material of the conductive structure 172 does not diffuse into the semiconductor layer 13.

It should be noted that, the element of the conductive structure 171 does not diffuse into the semiconductor layer 13 due to the application of the intermediate layer 16. It should be noted that, the material of the conductive structure 171 does not diffuse into the semiconductor layer 13 after the annealing operation due to the application of the intermediate layer 16. It should be noted that, the element of the conductive structure 171 does not diffuse into the semiconductor layer 13 after the annealing operation due to the application of the intermediate layer 16. It should be noted that, the element of the conductive structure 171 does not diffuse into the semiconductor layer 13 during the annealing operation due to the application of the intermediate layer 16.

It should be noted that, the element of the conductive structure 172 does not diffuse into the semiconductor layer 13 due to the application of the intermediate layer 16. It should be noted that, the material of the conductive structure 172 does not diffuse into the semiconductor layer 13 after the annealing operation due to the application of the intermediate layer 16. It should be noted that, the element of the conductive structure 172 does not diffuse into the semiconductor layer 13 after the annealing operation due to the application of the intermediate layer 16. It should be noted that, the element of the conductive structure 172 does not diffuse into the semiconductor layer 13 during the annealing operation due to the application of the intermediate layer 16.

It should be noted that, the intermediate layer 16 may be heat resistant. It should be noted that, the intermediate layer 16 may be heat resistant to prevent the element of the conductive structure 171 from entering the semiconductor layer 13. It should be noted that, the intermediate layer 16 may be heat resistant to stop the element of the conductive structure 171 from entering the semiconductor layer 13. It should be noted that, the intermediate layer 16 may be heat resistant to stop the element of the conductive structure 171 from entering the semiconductor layer 13 during the appealing operation. It should be noted that, the intermediate layer 16 may be heat resistant to prevent the element of the conductive structure 172 from entering the semiconductor layer 13. It should be noted that, the intermediate layer 16 may be heat resistant to stop the element of the conductive structure 172 from entering the semiconductor layer 13. It should be noted that, the intermediate layer 16 may be heat resistant to stop the element of the conductive structure 172 from entering the semiconductor layer 13 during the appealing operation.

Figure 4:
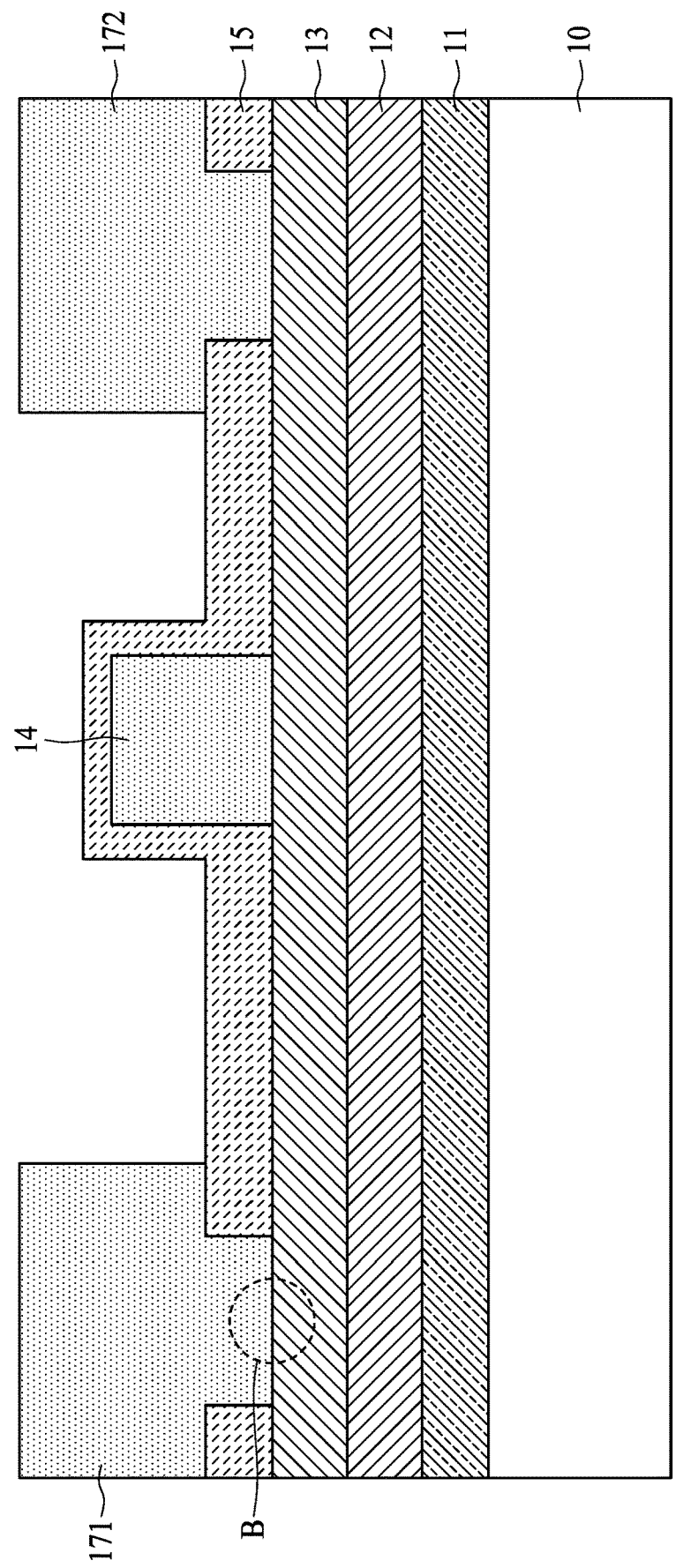
FIG. 4 is a side view of a semiconductor device according to some embodiments of the disclosure.

FIG. 4 is a side view of a semiconductor device according to some comparative embodiments of the disclosure.

As shown in FIG. 4, the semiconductor device is similar to the semiconductor device 1 shown in FIG. 1A, but differs in that the semiconductor device shown in FIG. 4 does not include any intermediate layer. In some embodiments, the conductive structure 171 may be disposed on the semiconductor layer 13. In some embodiments, the conductive structure 171 may contact the semiconductor layer 13. In some embodiments, the conductive structure 171 may contact the passivation layer 15. In some embodiments, the conductive structure 172 may be disposed on the semiconductor layer 13. In some embodiments, the conductive structure 172 may contact the semiconductor layer 13. In some embodiments, the conductive structure 172 may contact the passivation layer 15. The structure in dotted circle B in FIG. 4 is illustrated in FIG. 5.

Figure 5:
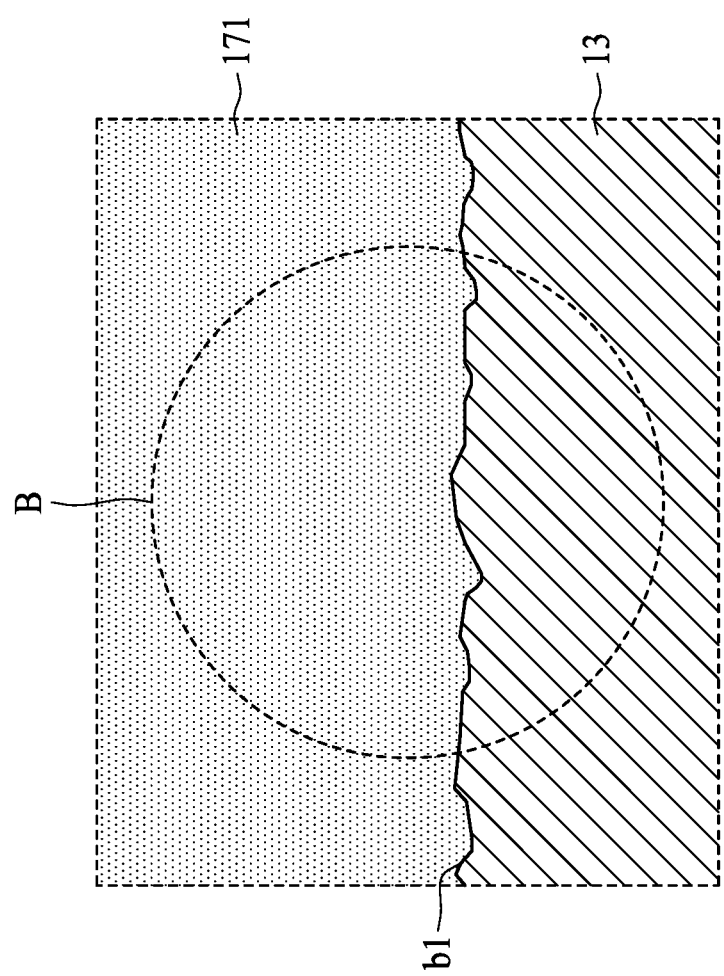
FIG. 5 is an enlarged view of structure according to some embodiments of the disclosure.

FIG. 5 is an enlarged view of structure in dotted circle B as shown in FIG. 4 in accordance with some comparative embodiments of the present disclosure.

As shown in FIG. 5, the semiconductor layer 13 and the conductive structure 171 may be included in the dotted circle B. An interface b1 may be formed between the semiconductor layer 13 and the conductive structure 171.

The interface b1 may be uneven. The interface b1 may be rough. The interface b1 may be rugged. The interface b1 may be unclear.

Also referring to FIG. 5, the material of the conductive structure 171 may enter the semiconductor layer 13. The element of the conductive structure 171 may enter the semiconductor layer 13. The element of the conductive structure 171 may diffuse into the semiconductor layer 13.

The element of the conductive structure 171, such as Ti, may diffuse into the semiconductor layer 13. The element of the conductive structure 171, such as Ti, may diffuse into the semiconductor layer 13 during an annealing operation. The element of the conductive structure 171, such as Ti, may diffuse into the semiconductor layer 13 during an annealing operation so that the semiconductor layer 13 contains Ti residues. It should be noted that, the semiconductor layer 13 should be protected. It should be noted that, the semiconductor layer 13 should not be damaged. It should be noted that, if the semiconductor layer 13 is not damaged, the semiconductor layer 13 and the conductive structure 171 may have a good ohmic contact. It should be noted that, if the semiconductor layer 13 is not damaged, the semiconductor layer 13 and the conductive structure 171 may have an ohmic contact with low resistance. It should be noted that, if the semiconductor layer 13 is not damaged, the semiconductor layer 13 and the conductive structure 171 may have an ohmic contact with resistance of about 0.3 Ω·mm. It should be noted that, if the semiconductor layer 13 is damaged, the semiconductor device may have unsatisfactory electrical properties. It should be noted that, if the semiconductor layer 13 is damaged due to the diffusion of the conductive structure 171, the semiconductor device may have ordinary electrical properties. It should be noted that, if the semiconductor layer 13 is damaged due to the diffusion of the conductive structure 171 during an annealing operation, the semiconductor device may have ordinary electrical properties.

As used herein, for ease of description, space-related terms such as "under", "below", "lower portion", "above", "upper portion", "lower portion", "left side", "right side", and the like may be used herein to describe a relationship between one component or feature and another component or feature as shown in the figures. In addition to orientations shown in the figures, space-related terms are intended to encompass different orientations of the device in use or operation. A device may be oriented in other ways (rotated 90 degrees or at other orientations), and the space-related descriptors used herein may also be used for explanation accordingly. It should be understood that when a component is "connected" or "coupled" to another component, the component may be directly connected to or coupled to another component, or an intermediate component may exist.

As used herein, terms "approximately", "basically", "substantially", and "about" are used for describing and considering a small variation. When being used in combination with an event or circumstance, the term may refer to a case in which the event or circumstance occurs precisely, and a case in which the event or circumstance occurs approximately. As used herein with respect to a given value or range, the term "about" generally means in the range of ±10%, ±5%, ±1%, or ±0.5% of the given value or range. The range may be indicated herein as from one endpoint to another endpoint or between two endpoints. Unless otherwise specified, all the ranges disclosed in the disclosure include endpoints. The term "substantially coplanar" may refer to two surfaces within a few micrometers (μm) positioned along the same plane, for example, within 10 μm, within 5 μm, within 1 μm, or within 0.5 μm located along the same plane. When reference is made to "substantially" the same numerical value or characteristic, the term may refer to a value within ±10%, ±5%, ±1%, or ±0.5% of the average of the values.

Several embodiments of the disclosure and features of details are briefly described above. The embodiments described in the disclosure may be easily used as a basis for designing or modifying other processes and structures for realizing the same or similar objectives and/or obtaining the same or similar advantages introduced in the embodiments of the disclosure. Such equivalent constructions do not depart from the spirit and scope of the disclosure, and various variations, replacements, and modifications can be made without departing from the spirit and scope of the disclosure.

What is claimed is:

1. A semiconductor device, comprising:
   a substrate;
   a first nitride semiconductor layer on the substrate;
   a second nitride semiconductor layer on the first nitride semiconductor layer and having a band gap larger than a band gap of the first nitride semiconductor layer;
   a gate conductor disposed on the second nitride semiconductor layer;
   a dielectric passivation layer partially disposed on the second nitride semiconductor layer and extending over the gate conductor;
   an intermediate layer disposed on the second nitride semiconductor layer, the intermediate layer having a thickness of approximately 4.5 nm to approximately 15 nm and extending over at least a portion of the dielectric passivation layer; and
   a conductive structure disposed on the intermediate layer, wherein a first even interface is formed between the intermediate layer and the second nitride semiconductor layer and wherein the gate conductor is separated from the intermediate layer by the passivation layer.

2. The semiconductor device according to claim 1, wherein a second even interface is formed between the intermediate layer and the conductive structure.

3. The semiconductor device according to claim 1, wherein the intermediate layer and the conductive structure form an ohmic contact with the second nitride semiconductor layer.

4. The semiconductor device according to claim 1, wherein the intermediate layer comprises at least one of titanium nitride (TiN) and aluminum nitride (AlN).

5. The semiconductor device according to claim 1, wherein the thickness of the intermediate layer is about 5 nm.

6. The semiconductor device according to claim 1, wherein the second nitride semiconductor layer comprises: aluminum gallium nitride (AlGaN).

7. The semiconductor device according to claim 6, wherein the second nitride semiconductor layer is devoid of titanium (Ti).

8. The semiconductor device according to claim 1, wherein the conductive structure comprises: at least one of titanium (Ti), aluminum (Al) and silicon (Si).

9. The semiconductor device according to claim 1, wherein the first nitride semiconductor layer comprises: gallium nitride (GaN).

10. The semiconductor device according to claim 1, wherein the intermediate layer extends over an entire length of the dielectric passivation layer.

11. A semiconductor device, comprising:
    a substrate;
    a first nitride semiconductor layer on the substrate;
    a second nitride semiconductor layer on the first nitride semiconductor layer and having a band gap larger than a band gap of the first nitride semiconductor layer;
    a gate conductor disposed on the second nitride semiconductor layer;

a dielectric passivation layer partially disposed on the second nitride semiconductor layer and extending over the gate conductor;

a first intermediate layer disposed on the second nitride semiconductor layer, the first intermediate layer having a thickness of approximately 4.5 nm to approximately 15 nm and extending over at least a portion of the dielectric passivation layer; and a first conductive structure disposed on the first intermediate layer, wherein the first intermediate layer under the first conductive structure has a substantially constant thickness.

12. The semiconductor device according to claim 11, further comprising:

a second intermediate layer disposed on the second nitride semiconductor layer; and a second conductive structure disposed on the second intermediate layer, wherein the second intermediate layer under the second conductive structure has a substantially constant thickness.

13. The semiconductor device according to claim 12, wherein the first intermediate layer and the second intermediate layer are separated.

14. The semiconductor device according to claim 11, wherein the first intermediate layer comprises metal nitride.

15. The semiconductor device according to claim 14, wherein the metal nitride comprises titanium (Ti).

16. The semiconductor device according to claim 14, wherein the metal nitride comprises aluminum (Al).

17. The semiconductor device according to claim 11, wherein the second nitride semiconductor layer comprises aluminum gallium nitride (AlGaN).

18. The semiconductor device according to claim 17, wherein the second nitride semiconductor layer is devoid of titanium (Ti).

19. A method for fabricating a semiconductor device, comprising:

providing a substrate;

forming a first nitride semiconductor layer on the substrate;

forming a second nitride semiconductor layer having a band gap larger than a band gap of the first nitride semiconductor layer on the first nitride semiconductor layer;

forming a gate conductor disposed on the second nitride semiconductor layer;

forming a dielectric passivation layer partially disposed on the second nitride semiconductor layer and extending over the gate conductor;

forming an intermediate layer on the second nitride semiconductor layer to stop diffusion of a first element, the intermediate layer having a thickness of approximately 4.5 nm to approximately 15 nm and extending over at least a portion of the dielectric passivation layer;

forming a first conductive layer having the first element on the intermediate layer, and performing an annealing operation.

20. The method according to claim 19, wherein the first element includes titanium (Ti).

21. The method according to claim 19, wherein the intermediate layer comprises: metal nitride.

22. The method according to claim 21, wherein the metal nitride comprises:

titanium (Ti).

23. The method according to claim 21, wherein the metal nitride comprises:

aluminum (Al).

* * * * *